United States Patent
Sicuranza

(10) Patent No.: US 9,059,372 B2
(45) Date of Patent: Jun. 16, 2015

(54) SYSTEM FOR RECYCLING ENERGY

(76) Inventor: Jeffrey Sicuranza, Wantagh, NY (US)

(*) Notice: Subject to any disclaimer, the term of this patent is extended or adjusted under 35 U.S.C. 154(b) by 1280 days.

(21) Appl. No.: 12/241,999

(22) Filed: Sep. 30, 2008

(65) Prior Publication Data

US 2009/0107536 A1 Apr. 30, 2009

Related U.S. Application Data

(60) Provisional application No. 60/982,568, filed on Oct. 25, 2007, provisional application No. 60/982,576, filed on Oct. 25, 2007, provisional application No. 61/100,003, filed on Sep. 25, 2008.

(51) Int. Cl.
| | |
|---|---|
| *H01L 35/02* | (2006.01) |
| *H01L 35/30* | (2006.01) |
| *H01L 23/38* | (2006.01) |
| *H05K 7/20* | (2006.01) |
| *H01L 35/00* | (2006.01) |
| *H01L 35/32* | (2006.01) |

(52) U.S. Cl.
CPC .............. *H01L 35/30* (2013.01); *H01L 35/00* (2013.01); *H01L 35/32* (2013.01); *H01L 23/38* (2013.01); *H05K 7/20727* (2013.01); *H01L 2924/0002* (2013.01)

(58) Field of Classification Search
CPC ......... H01L 35/00; H01L 35/30; H01L 35/32; H01L 23/38; H01L 2924/0002; H01L 2924/00; H05K 7/20727
USPC .................................................. 136/200–210
See application file for complete search history.

(56) References Cited

U.S. PATENT DOCUMENTS

| | | | | |
|---|---|---|---|---|
| 3,957,541 | A | * 5/1976 | Bustard et al. | ............. 136/205 |
| 4,622,472 | A | 11/1986 | Bronicki | |
| 4,651,019 | A | 3/1987 | Gilbert et al. | |
| 5,065,085 | A | 11/1991 | Aspden et al. | |
| 5,419,780 | A | 5/1995 | Suski | |
| 5,427,086 | A | 6/1995 | Brownell | |
| 5,625,245 | A | 4/1997 | Bass | |
| 6,291,760 | B1 | * 9/2001 | Mitamura | ............. 136/205 |
| 6,307,142 | B1 | 10/2001 | Allen et al. | |
| 6,407,965 | B1 | 6/2002 | Matoge et al. | |
| 6,461,752 | B1 | 10/2002 | Leung | |
| 6,527,548 | B1 | 3/2003 | Kushch et al. | |

(Continued)

OTHER PUBLICATIONS

Thermoelectric Technical Reference-Power Generation, Ferrotec Corporation, 2007.

(Continued)

*Primary Examiner* — Matthew Martin
(74) *Attorney, Agent, or Firm* — The Farrell Law Firm, P.C.

(57) ABSTRACT

A system for generating electrical energy is disclosed. The system includes at least one device having a plurality of heat radiating components each having a cooling component. The system includes a converter system comprising a plurality of thermal electric generators contained in each of the at least one device, each of the plurality of thermal electric generators integrated between a respective one of the plurality of heat radiating components and its respective cooling component, the plurality of thermal electric generators electrically interconnected according to power requirements of the at least one device, and the plurality of thermal electric generators generating power used to power the at least one device.

11 Claims, 19 Drawing Sheets

(56) References Cited

U.S. PATENT DOCUMENTS

| | | |
|---|---|---|
| 6,591,610 B2 | 7/2003 | Yazawa et al. |
| 6,799,282 B2* | 9/2004 | Maeda et al. .................. 713/500 |
| 7,012,554 B2 | 3/2006 | Hiller et al. |
| 7,081,686 B2 | 7/2006 | Yang |
| 7,180,264 B2* | 2/2007 | Smith et al. ................... 320/101 |
| 7,528,502 B2* | 5/2009 | Maeda ............................ 307/46 |
| 2002/0184895 A1* | 12/2002 | Anderson et al. ................. 62/3.6 |
| 2003/0093995 A1 | 5/2003 | Tadayon et al. |
| 2003/0117760 A1 | 6/2003 | Meir |
| 2003/0133265 A1 | 7/2003 | Kinsey et al. |
| 2005/0073150 A1 | 4/2005 | Patel et al. |
| 2005/0161072 A1* | 7/2005 | Esser et al. ..................... 136/205 |
| 2005/0204747 A1 | 9/2005 | Atkinson |
| 2006/0107987 A1 | 5/2006 | Chen et al. |
| 2007/0056622 A1* | 3/2007 | Leng et al. ..................... 136/205 |
| 2007/0095381 A1* | 5/2007 | Lee ................................ 136/230 |

OTHER PUBLICATIONS

Thermoelectrics by Tellurex Corporation, Tellurex Corporation, 2007.

Examples of Power From Waste Heat for Gas Fields, John C. Bass and Robert L. Farley, 1997.

Further Development of "Self-Powered Boilers", Daniel T. Allen and Wim Ch. Mallon, 1999.

Thermoelectric Development at Hi-Z Technology, Aleksandr S. Kushch, John C. Bass, Saeid Ghamaty, Norbert B. Elsner, Richard A. Bergstrand, David Furrow and Mike Melvin, Sep. 6-8, 2001.

Small Thermoelectric Generators, Daniel Allen, Robert Haugeto, Michael Kajor and Mehdi Namazian, 2002.

* cited by examiner

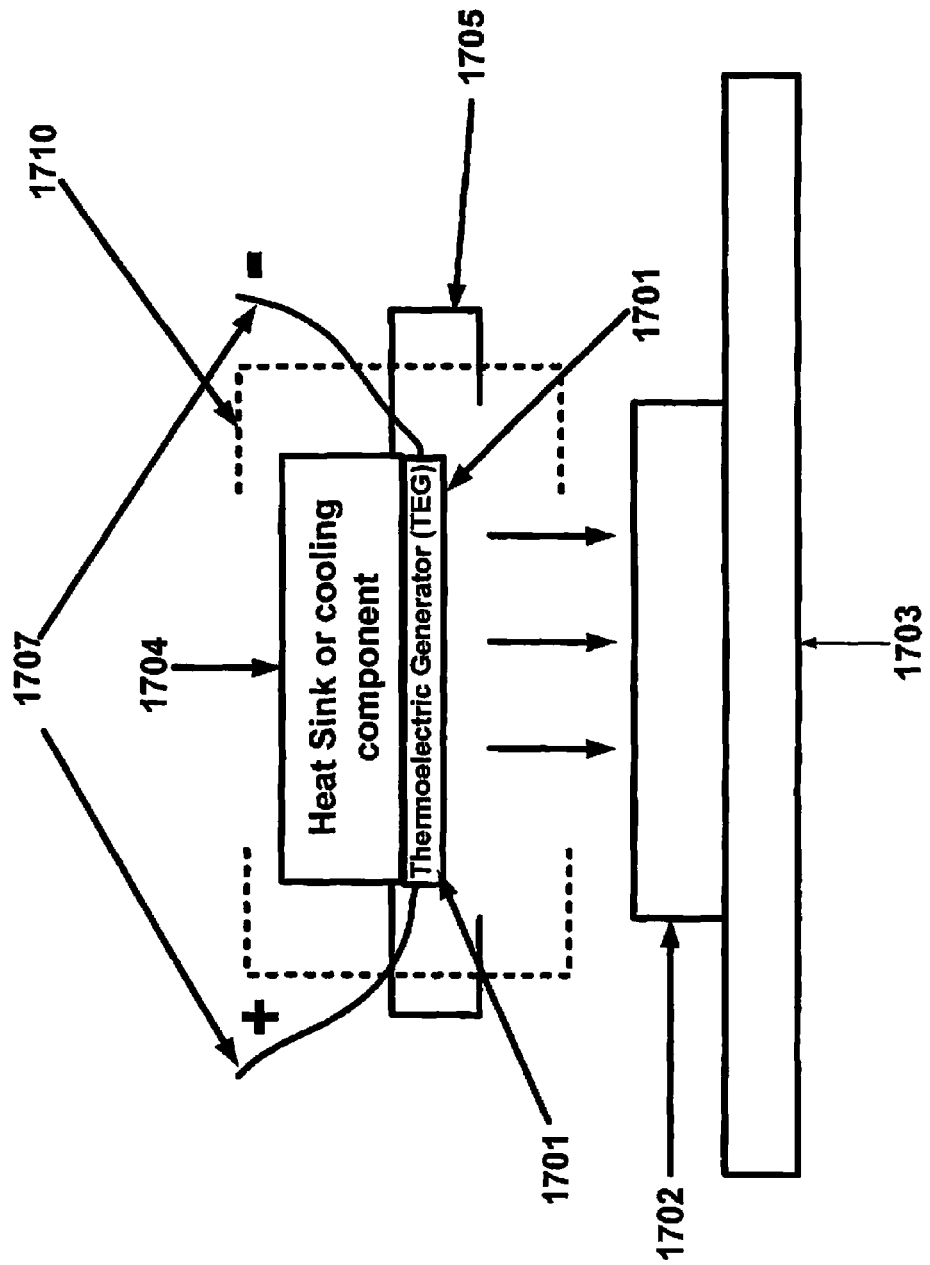

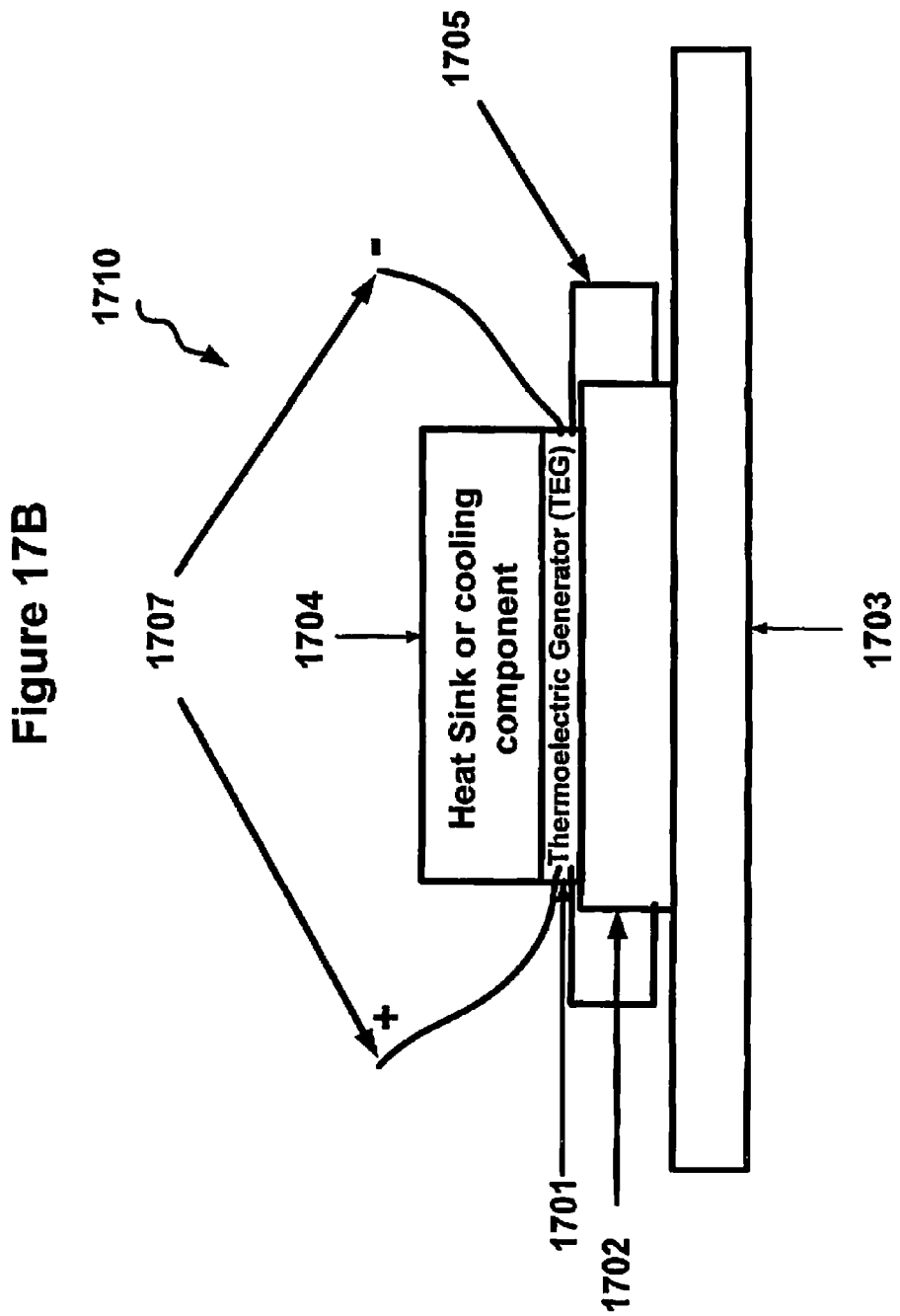

US 9,059,372 B2

SYSTEM FOR RECYCLING ENERGY

PRIORITY

This application claims the benefit of U.S. Provisional Application No. 60/982,568, filed Oct. 25, 2007, U.S. Provisional Application No. 60/982,576, filed Oct. 25, 2007, and U.S. Provisional Application No. 61/100,003, filed Sep. 25, 2008, the contents of each of which are incorporated herein by reference.

BACKGROUND OF THE INVENTION

With higher energy prices and the growth and expansion of computational power of data centers, plus the increasing energy demands for higher performance servers, router and switches, microprocessors, CPUs, chipsets and other supporting chips, is resulting in higher energy costs to consumers and corporate enterprises to power their data centers. Servers, routers and switches today require increasing amounts of power to achieve their high processing and computational capabilities. With this increase in performance and power, also comes an increase in the amount of Joule heating at which processors and chips operate, which in turn also increases the amount of heat energy radiated from the component which in turn increases the ambient temperatures within the case of a server, router or switch.

The industry has consistently identified a common set of issues, challenges and solutions regarding data center energy usage. Some of these issues include: rising data center energy costs; cooling challenges of the data center and individual devices; rising power requirements of faster chips and systems; rising overall power consumption of the data center; power requirements of multi-core CPUs; efficiency of performance per watt and thermal design points; environmental standards and regulations; newer CPU and general microchip technologies, smaller dies, lower voltage CPUs and intelligent thermal monitor and control subsystems of a CPU or other chips; virtualization as a means to reduce required power consumption and carbon footprint; DC based systems, distribution and devices such as routers and servers; and, next generation equipment requiring greater operating power levels. All of the relative challenges and approaches are being balanced to assist in reducing a data center's power related operating expenses in an efficient and satisfactory manner.

One attempt to address these power concerns is realized through the recycling of the heat energy produced by the data centers. The concept is based on converting the heat energy into electrical energy. Without much success, several attempts have been made to perfect these types of recycling systems. Some examples are disclosed in U.S. Pat. Nos. 5,419,780 and 6,799,282, and U.S. Application Publications 2003/0093995, 2003/0133265, 200510073150 and 2006/0107987, the contents of each of which are incorporated herein by reference.

SUMMARY OF THE INVENTION

Accordingly, the present invention has been made to solve at least the above-mentioned problems occurring in the prior art, and an object of the present invention is to provide a system for generating electrical energy.

To accomplish the above objects, there is provided a system for generating electrical energy, the system having at least one device having a plurality of heat radiating components each having a cooling component, that includes a converter system comprising a plurality of thermal electric generators contained in each of the at least one device, each of the plurality of thermal electric generators integrated between a respective one of the plurality of heat radiating components and its respective cooling component, said plurality of thermal electric generators electrically interconnected according to power requirements of the at least one device, and said plurality of thermal electric generators generating power used to power the at least one device or used to power another device.

BRIEF DESCRIPTION OF THE DRAWINGS

The above and other objects, features and advantages of the present invention will be more apparent from the following detailed description taken in conjunction with the accompanying drawings, in which:

FIGS. 17A and 17B is an example of a self mounting TEG unit.

DETAILED DESCRIPTION OF THE PREFERRED EMBODIMENT

Figure 1:
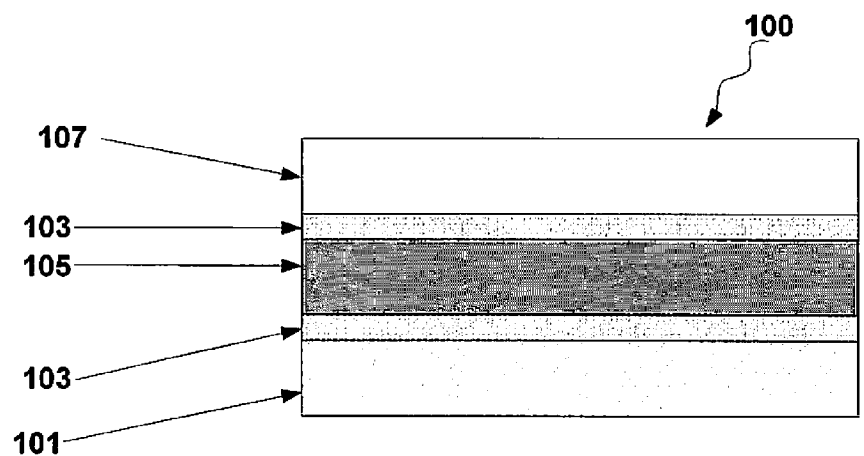
FIG. 1 is a diagram illustrating a Thermal Electric Generator (TEG) on a heat radiating component.

A preferred embodiment of the present invention will be described in detail with reference to the accompanying drawings. Note that the same or similar components in drawings are designated by the same reference numerals as far as possible although they are shown in different drawings. In the following description of the present invention, a detailed description of known functions and configurations incorporated herein will be omitted when it may make the subject matter of the present invention rather unclear.

Reference will also be made to the drawings in which the various elements of the present invention will be given numerical designations. In its present form the invention consists of several distinct elements. These elements when combined as described within will allow one of ordinary skill in the art to made and use the present invention.

The present invention relates to the conversion of a non-useful form of potential energy in any computing system, i.e. heat, and transferring it back into a useful form of electrical energy to reduce the energy consumed for the same computing system from the utility feed. The present invention also relates to the use of multiple Thermal Electric Generators (TEGs) integrated into a computer system to scale the amount of useful energy generated. The present invention also maximizes the energy conversion capabilities of a TEG or multiple TEGs incorporated into a system. The conversion of heat energy from the computer components will provide electrical energy in the form of DC current to be used in the same system or externally.

A device as used herein consists of, but is not limited to, servers, routers, switches, storage servers, firewalls, content switches, personal computers, etc. A heat radiating source as used herein consists of, but is not limited to, Integrated Circuits (ICs), Central Processing Units (CPUs), network controllers, video controllers, hard disks, storage controllers, hot power supply circuitry components, computer cases, and any other heat source inside a system that emits heat energy therefrom.

FIG. 1 is a diagram illustrating a Thermal Electric Generator (TEG) on a heat radiating component. A TEG unit 100 includes a TEG 105, for example a Seebeck element module, integrated in between a heat radiating component 101 and its cooling component 107 to provide the temperature difference required for the TEG 105 to operate. The cooling component 107 can be added to heat radiating component 101 that does not have a cooling component 107 when a TEG 105 is integrated in between the heat radiating component 101 and the added cooling component 109 to improve the generating efficiency of the TEG 105. In a preferred embodiment, thermal grease 103, or other thermal compound that exhibits high thermal conductivity, is integrated between the heat radiating component 101 and the TEG 105. Thermal grease 103, or other thermal compound, can also be integrated between the TEG 105 and the cooling component 109.

One heat radiating component is the CPU, which is the component in a computer system that generates the most heat byproduct during its use. Integrating a TEG between the CPU and its cooling component will add some thermal resistance against the cooling of the CPU. However, this thermal resistance will vary and depending upon other factors of the TEG's construction materials and thermal compound used, the thermal resistance can be low enough for safe and effective operation, yet add to the temperature gradient required for a usable amount of energy to be generated.

The TEG has one side, i.e. its Th or "hot" side, in contact with the heat radiating component with the proper thermal grease in between the TEG and the component. The TEG will have its other side, i.e. its cold side, either exposed, if the ambient temperature in the internal system case is cool enough for a sufficient temperature gradient to be present, or in contact with a passive cooling system, e.g. a heat sink, applied to the TEG or an active cooling system, e.g. a fan, applied to the TEG to create the optimal temperature gradient for the generator to operate. Thermal compound or grease can also be applied to the cold side of the TEG. The smoothness of the surfaces will contribute highly to the efficiency of the TEG.

Compression loading of the TEG's hot side to the heat radiating component to improve generation efficiency is also contemplated. Compression loading of a cooling component to the TEG's cold side will also improve the generation efficiency of the TEG. The application of compression loading upon the TEG, cooling component and heat radiating component is used to achieve maximum thermal conductance, minimize thermal resistance and thermal bypass to ensure that a majority if not all of the waste heat passes through the TEG and not around it or out the sides and maximize the generation efficiency of the TEG.

Placing the TEG on top of the CPU provides the TEG with the highest of hot side temperatures for a sufficient temperature gradient to exist between the TEG's hot side and its cold side where the CPU's cooling system will sit. This temperature gradient will yield significant voltages, upwards of over 5 volts, generated from the TEG. A temperature gradient of 30-40 degrees Celsius yields exceptional potential electrical generation from a TEG. The configuration of the TEG on top of the heat radiating source can vary in different embodiments as well. The integration of the TEG into a cooling system to reduce thermal bypass or improve generation efficiency is will be described in more detail below.

Figure 2:
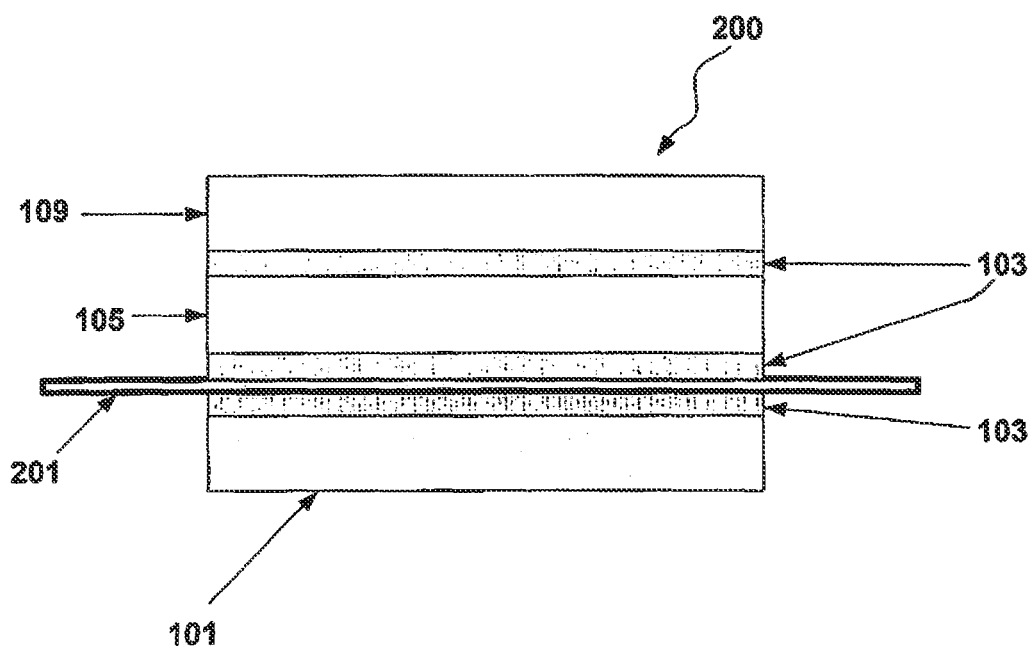
FIG. 2 is a diagram illustrating the use of a heat spreader with the TEG.

FIG. 2 is a diagram illustrating of the use of a heat spreader with the TEG according to an embodiment of the present invention. Shown in FIG. 2 is TEG unit 200 that is similar to TEG unit 100 of FIG. 1, except that TEG unit 200 includes a heat spreader 201 integrated between the heat radiating component 101 and the TEG 105. Also, an additional layer of thermal grease 103 is included. The TEG upon the heat radiating component can be optimized for maximum figure of merit, Carnot efficiency, thermal conductance and match load by the use of heat spreaders. The placement of a high conductance material/metal, e.g. copper, acting as a heat spreader in between a heat radiated component and the TEG may enhance the thermal conductance from the heat radiating component to the TEG for greater TEG efficiency and compensate for the TEG's thermal resistance, depending upon a thermal analysis of the heat radiating source to use an additional heat conducting spreader. Applying the thermal compound, thermal grease, or any other material/chemical that exhibits high thermal conductance between the heat spreader and heat radiating component and between the heat spreader and TEG may also increase the TEG efficiency, and since most CPUs have a copper case cover for their chip a heat spreader may be an optimal component.

Figure 3A:
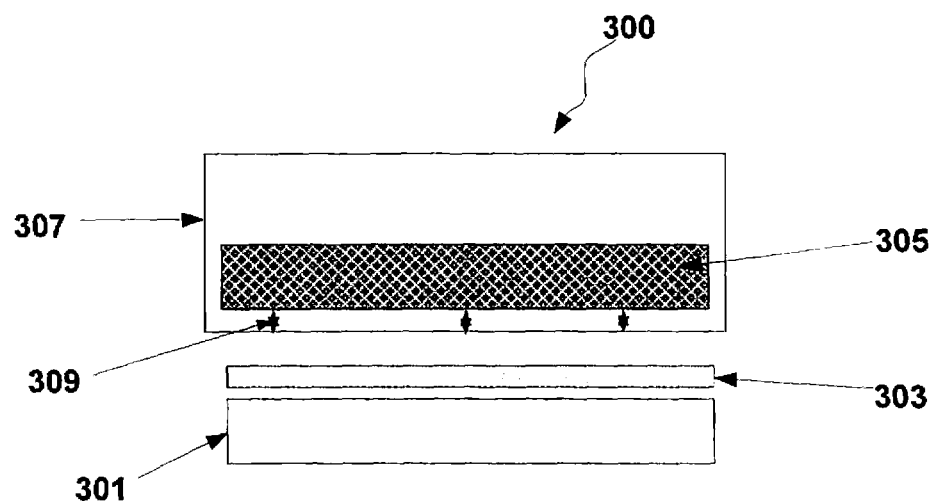
FIG. 3A is a diagram illustrating the integration of a TEG into a passive or active heat sink or cooling system.

FIG. 3A is a block diagram illustrating the integration of a TEG into a passive or active server heat sink or cooling system. TEG unit 300 includes a TEG 305 integrated within the heat sink/cooling system 307. The heat radiating component 301 is shown with thermal grease 303 integrated between the heat radiating component 301 and the heat sink/cooling system 307. This configuration of incorporating the TEG 305 within the heat sink/cooling system 307 reduces thermal bypass of the heat dissipated by the heat radiating component 301. This will ensure that as much of the radiated energy from the heat radiating component 301 goes through the TEG 305 and not around it or leak through its sides. The distance 309 between the TEG 305 and the base of the heat sink/cooling system 307 is adjusted to maximize the thermal conductance and the efficiency of the TEG 305.

Figure 3B:
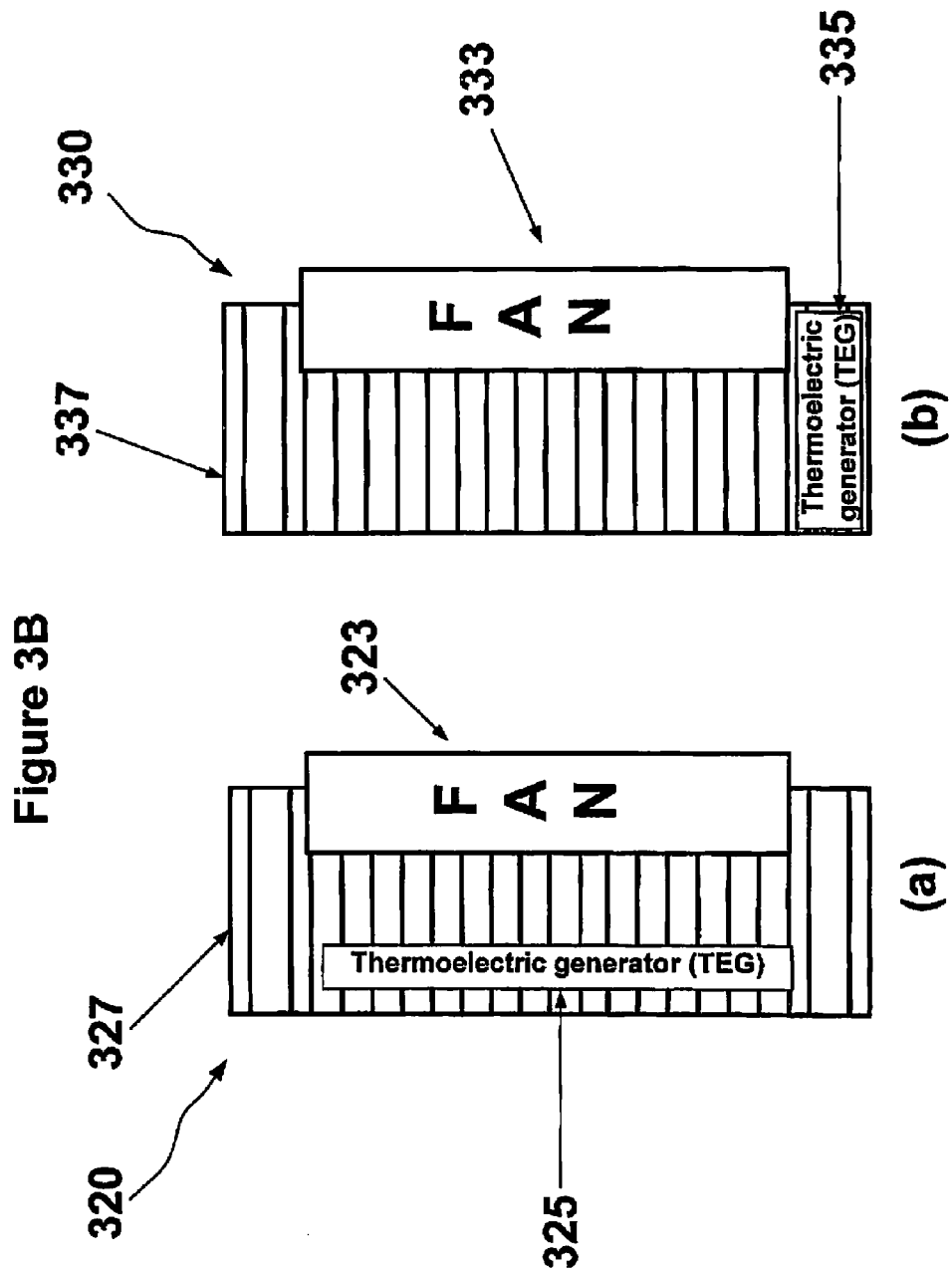
FIG. 3B are diagrams illustrating the integration of a TEG into a passive or active heat sink or cooling system.

FIG. 3B are diagrams illustrating the integration of a TEG into a passive or active heat sink or cooling system, including fluid based systems. In diagram (a) TEG unit 320 includes a TEG 325 integrated within the heat sink/cooling system 327. In this TEG unit 320, a fan 323 is shown as part of the heat sink/cooling system 327. The TEG 325 is located within the TEG unit 320 in a position parallel to the fan 323. In diagram (b) TEG unit 330 includes a TEG 335 integrated within the heat sink/cooling system 337. In this TEG unit 330, a fan 333 is shown as part of the heat sink/cooling system 337. The TEG 335 is located within the TEG unit 330 in a position perpendicular to the fan 333.

Figure 4:
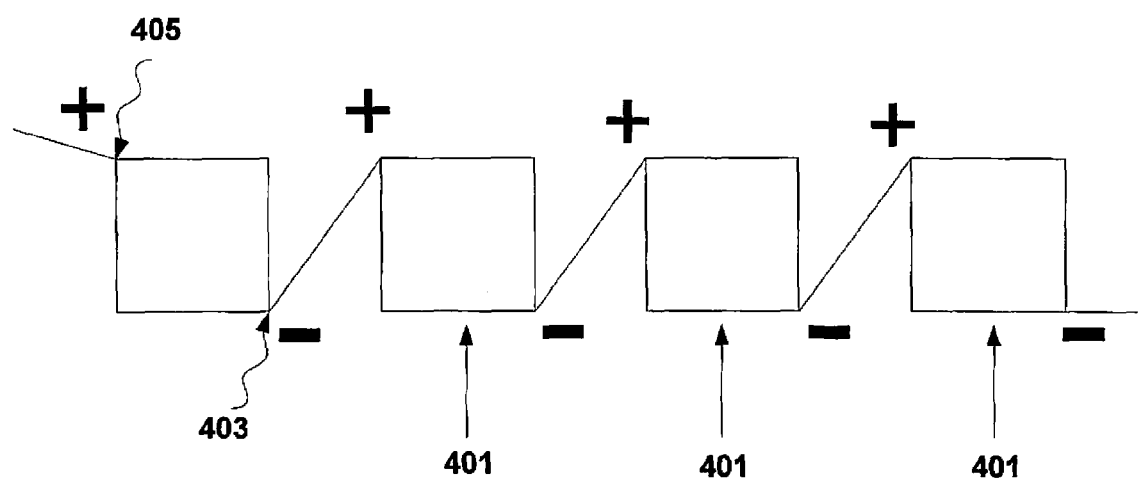
FIG. 4 is a diagram illustrating the electrical interconnection of the TEGs in a series voltage source circuit for energy generation scaling.

FIG. 4 is a diagram illustrating the electrical interconnection of TEGs in a series voltage source circuit for energy generation scaling. Each TEG 401 has a negative terminal 403 and a positive terminal 405. The TEGs 401 shown in FIG. 4 are connected in series thus combining the voltages of the individual TEGs 401. The TEGs 401 can be wired in various configurations depending upon the use of the energy generated. For example, if electrical current level from a single TEG 401 is adequate, but the voltage is insufficient the TEGs 401 can scale by placing additional modules electrically in series as shown in FIG. 4. AS another example, if the voltage level from a single TEG is adequate, but the current level is insufficient the TEGs can scale by placing place additional TEGs electrically in parallel. As a further example, if more voltage and current are required, various series, parallel, and series/parallel circuit combinations of TEGs can be determined that best matches the load conditions.

Figure 5:
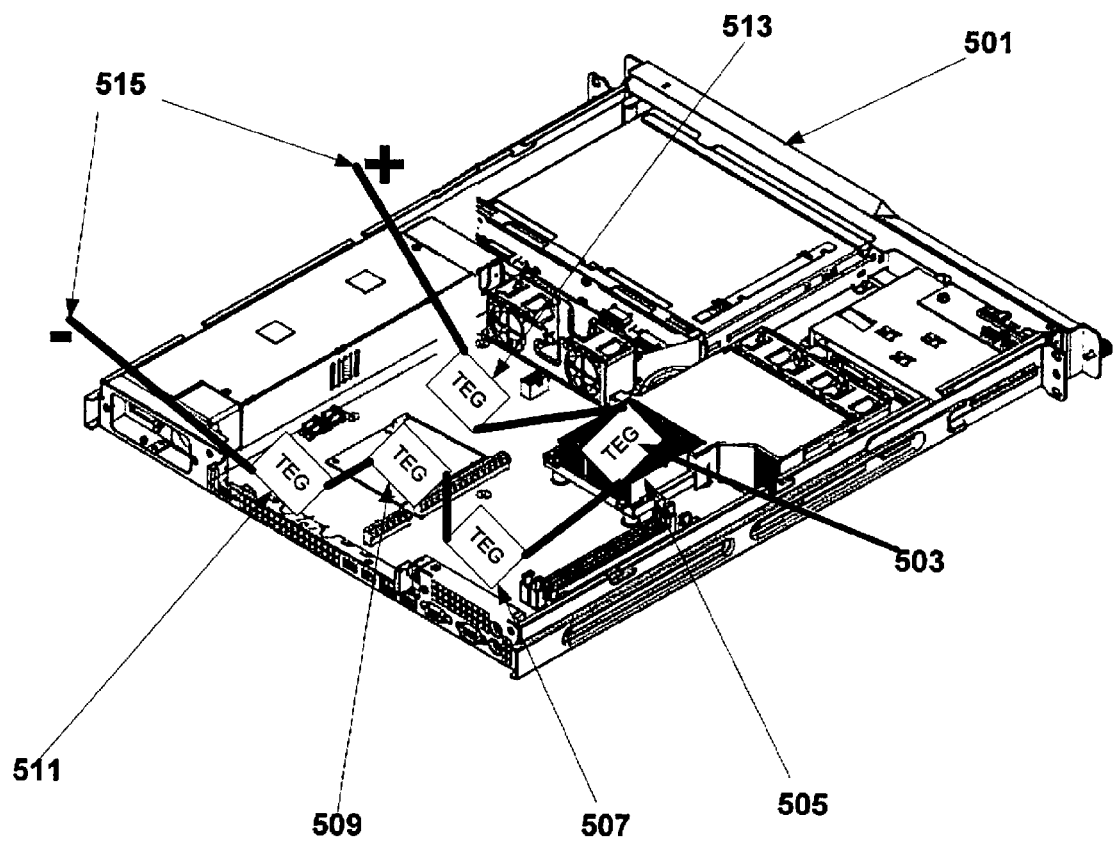
FIG. 5 is a diagram illustrating a rack server showing the integration of the TEGs.

FIG. 5 is a diagram illustrating a rack server showing the integration of the TEGs. Shown in FIG. 5 is an open view of a rack server 501 showing the integration of TEGs 503 and illustrates the use of multiple TEGs connected in a server to scale energy generation levels. Each TEG 503 is associated with a heat radiating component 505, 507, 509, 511 and 513. The heat radiating components can be, for example, a CPU, a network controller, a storage controller, or a video controller. In the particular embodiment shown in FIG. 5, the TEGs 503 are shown in a series connection having positive and negative leads 515 exiting from the rack server 501. Of course, the positive and negative leads 501 can connect within the rack server 501 to supply power within the rack server 501 itself. In another embodiment, a switch to control energy output can be connected to the positive or negative leads.

Figure 6:
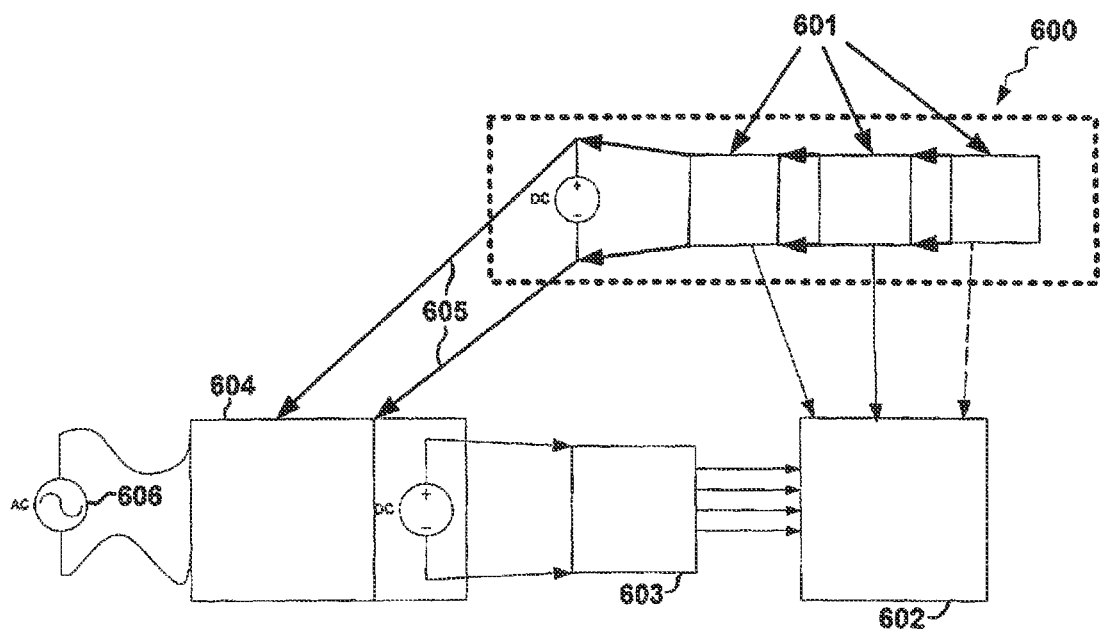
FIG. 6 is a diagram illustrating the integration of the energy from multiple TEGs into a power supply.

FIG. 6 is a diagram illustrating the integration of the power from multiple TEGs into a power supply according to an embodiment of the present invention. Server 602 is integrated with the TEGs 601. Server 602 receives power from the power supply 604 as various voltage level supplies 603 to system loads. The TEGs 601 are illustrated as a multi-TEG voltage source 600. Although shown external to the server 602, the TEGs 601 are integrated within the server as previously described. The output of the multi-TEG voltage source 600 is supplied to the power supply 604 through supplies 605 to increase the efficiency and reduce the power draw from the A/C supply 606. The power supply can be implemented as, for example, an external voltage converter or a power management and thermal management subsystem.

In one embodiment of the invention, external regulatory circuitry can be integrated between the TEGs 601 and the various voltage level supplies 603 to offset the electromotive force (EMF) from the main supply and for general DC conditioning. This regulatory circuitry may, but is not limited to, include shunt regulators, buck regulators, buck/boost DC/DC converters, bridge rectifiers, capacitance circuit/DC filters, voltage converters, or MOSFET/power management ICs. This regulatory circuitry can also be integrated between the output of the multi-TEG voltage source 600 and the power supply 604.

The output of the multi-TEG voltage source 600 can be supplied to various different points to integrate the power from the multi-TEG voltage source 600 into the power supply 604. For example, the DC output of the multi-TEG voltage source 600 can be input into a voltage converter, a bridge rectifier, an active clamp forward converter, a PFC pre-regulator a MOSFET, or a DC-to-DC converter.

Figure 7:
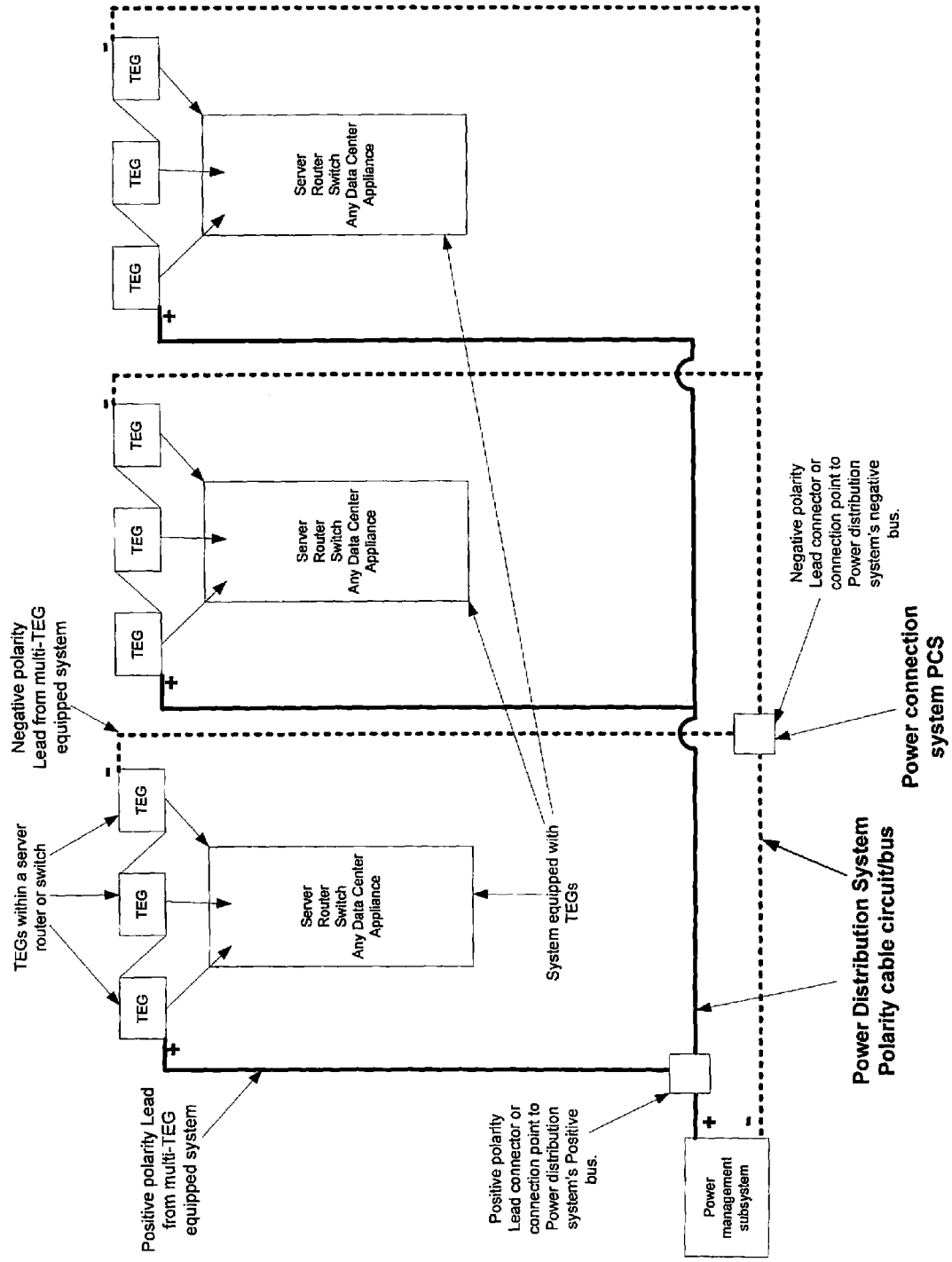
FIG. 7 is a diagram illustrating of a TEG server connected to a power distribution network.

FIG. 7 illustrates a simple block diagram of a TEG server with the positive and negative polarity leads from the TEG power source circuit inside the server/system having a special connector that snaps into a connector on the power distribution network. The power distribution network is illustrated as a simple series circuit and can be designed using any known methods. The polarity lead cabling from the server to the power distribution network can be of an appropriate gauge. A multi port power connection system can be devised to connect all of the TEG servers or converter systems into the power distribution network's backbone trunk. The power distribution network's cabling can include appropriate gauge wiring and can be wired into the rack, shelving and or cabinet as per rack wiring standards dictate for electrical cabling. In the embodiment shown in FIG. 7, the power management subsystem is centrally located so all the energy generated from each server in each rack will terminate centrally in the data center.

Figure 8:
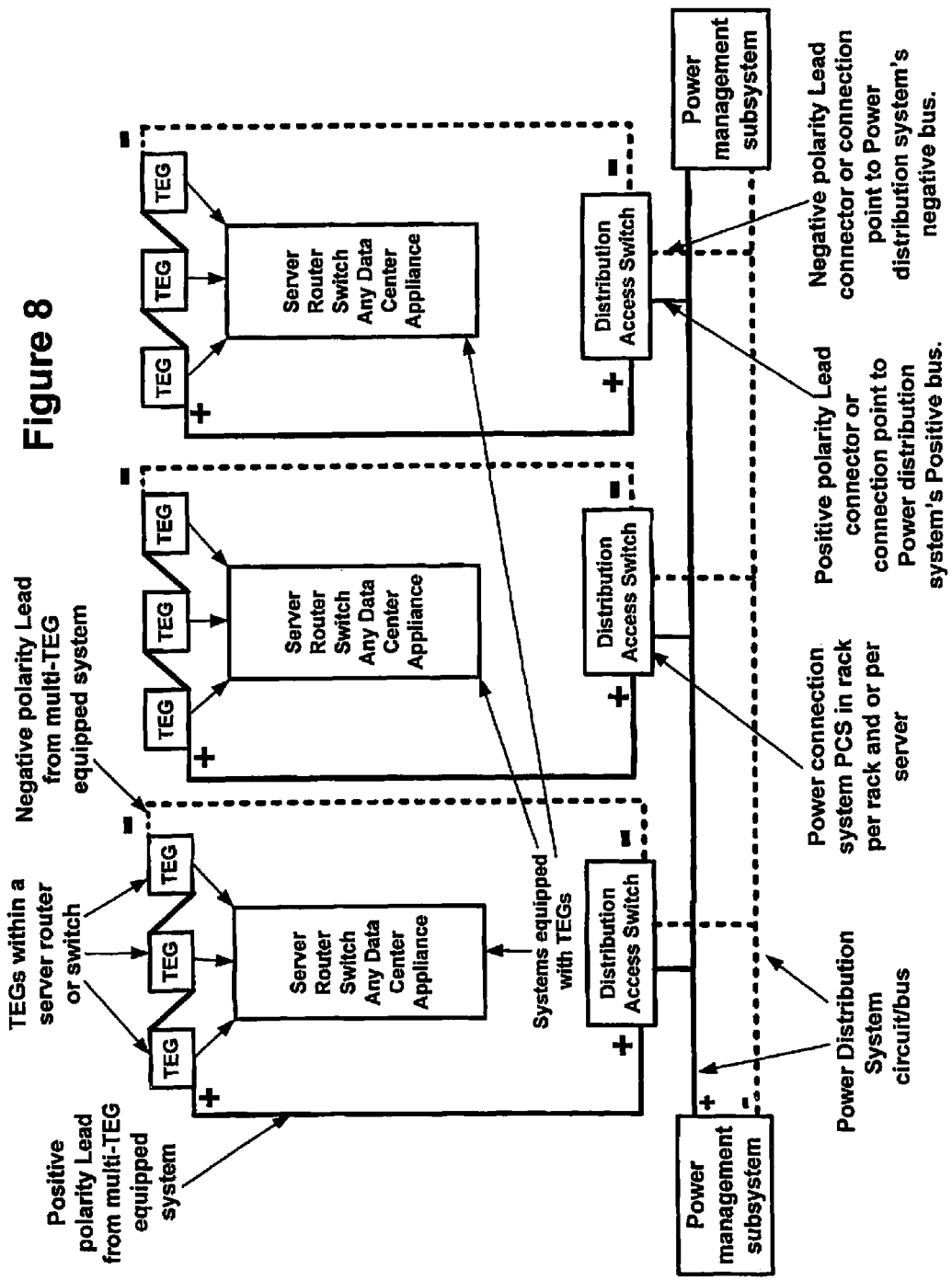
FIG. 8 is a diagram illustrating a TEG server connected to a power distribution network through a power connection system switch.

FIG. 8 illustrates a simple block diagram of TEG server connecting the polarity voltage source leads from each TEG server to a power distribution network. In this embodiment the polarity leads from the TEG power source circuit inside the server/system at each server connect into a switch that can either restrict/lower the energy flow generated from the server into the power distribution network or turn it off completely. The switch can be composed or configured in any manner and also as a dial. In this manner an individual TEG server's generated energy can be restricted or cut off from the power distribution network. Another embodiment of the invention can also entail a similar power switch for all TEG servers in the rack to the power distribution system as well. In this illustration the power distribution system terminates all the energy generated from the TEG servers in the data center into one or more power management subsystems located in the data center.

Figure 9:
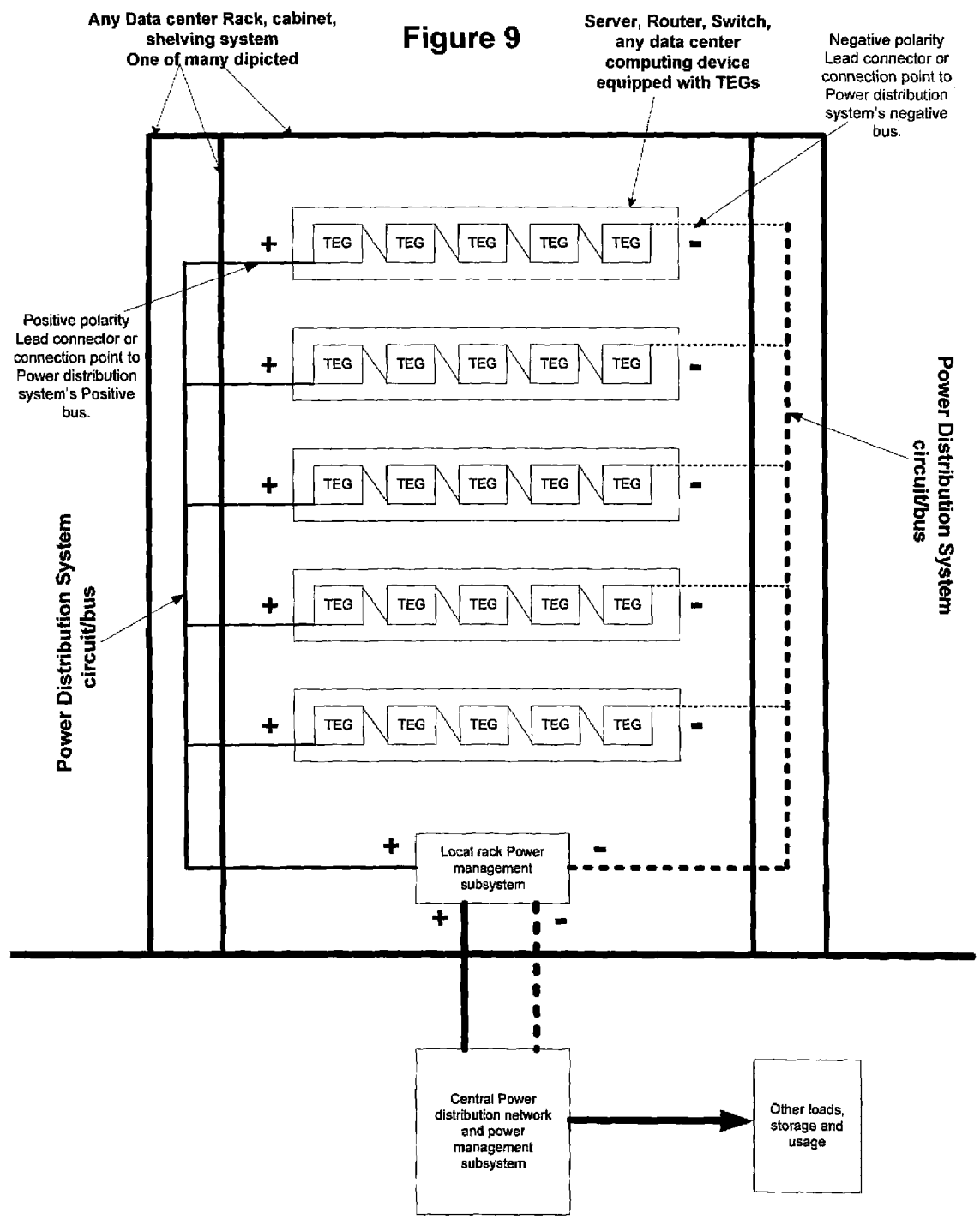
FIG. 9 is a diagram illustrating a TEG data center rack with TEGs integrated devices therein and connected into the power distribution network.

FIG. 9 illustrates a simple block diagram of a data center rack, shelving or cabinet based implementation of a TEG server equipped with multiple TEGs. In this embodiment each server's polarity leads from the TEG power source circuit inside the server/system are connected into the power distribution networks circuit or bus that is cabled into the rack. Each TEG server polarity lead can clip or snap into the power distribution network via a connector. The power distribution network's circuit or power bus can be cabled into any data center rack, cabinet or shelving system cabling conduit according to standards. In this embodiment of the invention a separate power distribution network can be equipped in each data center rack, cabinet or shelving system. The power distribution network can also be a separate network from the main distribution network that runs to all racks. In this embodiment each rack, cabinet and/or shelving system will have its own power distribution network with its own local power management subsystem for power management purposes. The rack's individual power management subsystem can control all TEG servers in the rack and restrict the flow of energy from an individual, group or entire rack of the TEG servers into the data center's main backbone power distribution network that connects to all of the data center's racks local power management subsystems. The centrally located power management subsystem can further regulate the flow of energy generated from data center TEG server racks to other loads. In this embodiment energy generated can be managed at the micro level per rack and at the macro lever per data center.

Figure 10:
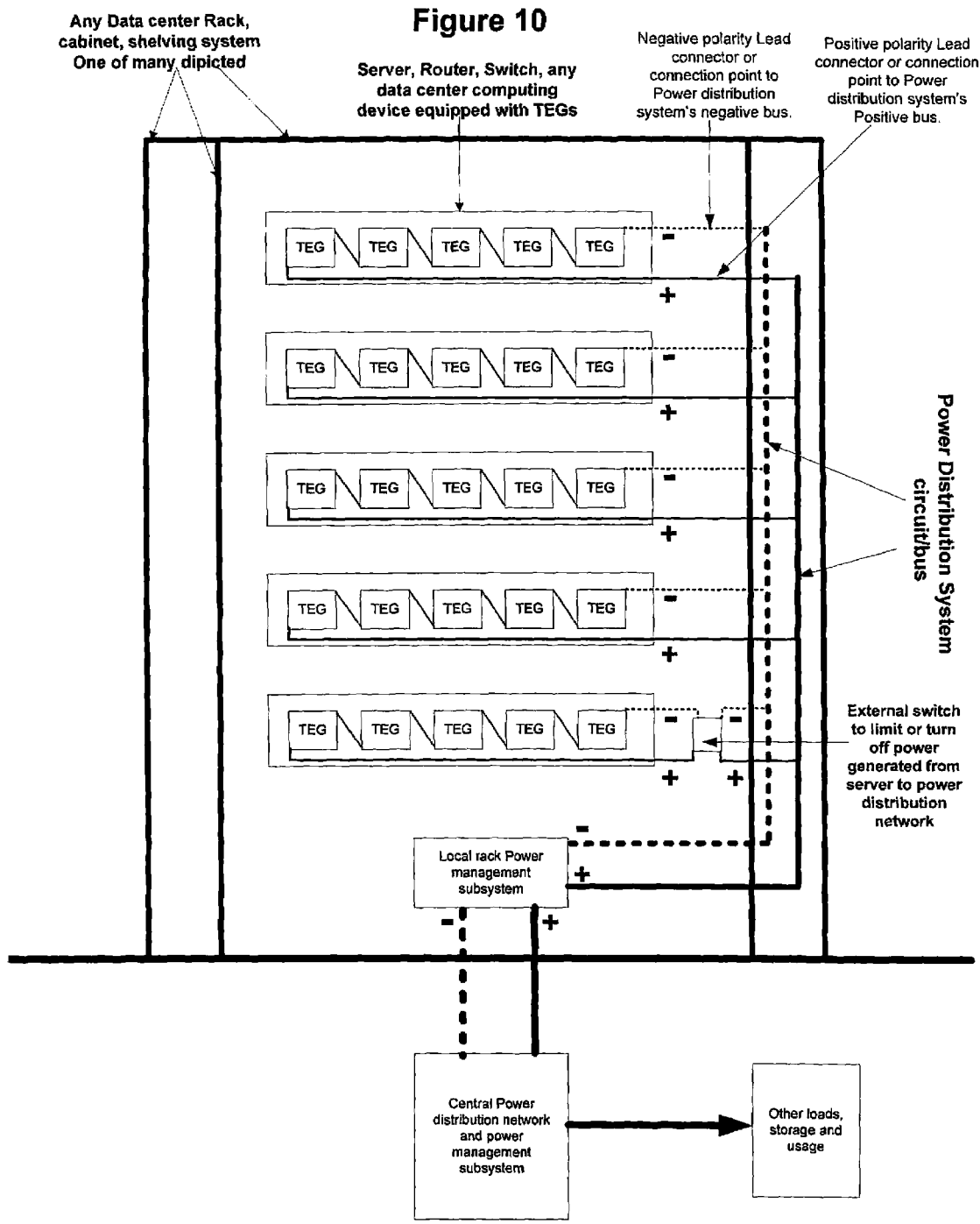
FIG. 10 is a diagram illustrating a TEG data center rack with one TEG connected through an external switch.

FIG. 10 illustrates a simple block diagram of a TEG data center rack, shelving or cabinet based implementation of a TEG server equipped with multiple TEGs. This embodiment is similar to the one outlined in FIG. 9, however the polarity cabling is just down one side of the rack. Also, in this embodiment of the invention the external per server switch to restrict or shut off the flow of energy generated from a TEG server is illustrated. The switch can be connected to the rack's power distribution network to restrict or shut off the flow of energy generated to the rack's local power management subsystem or can also be connected to the data center's power distribution backbone. This switch can also be defined as the physical voltage control attached to each server in the event that the local or central power management subsystems cannot manage a server's energy generated.

Figure 11:
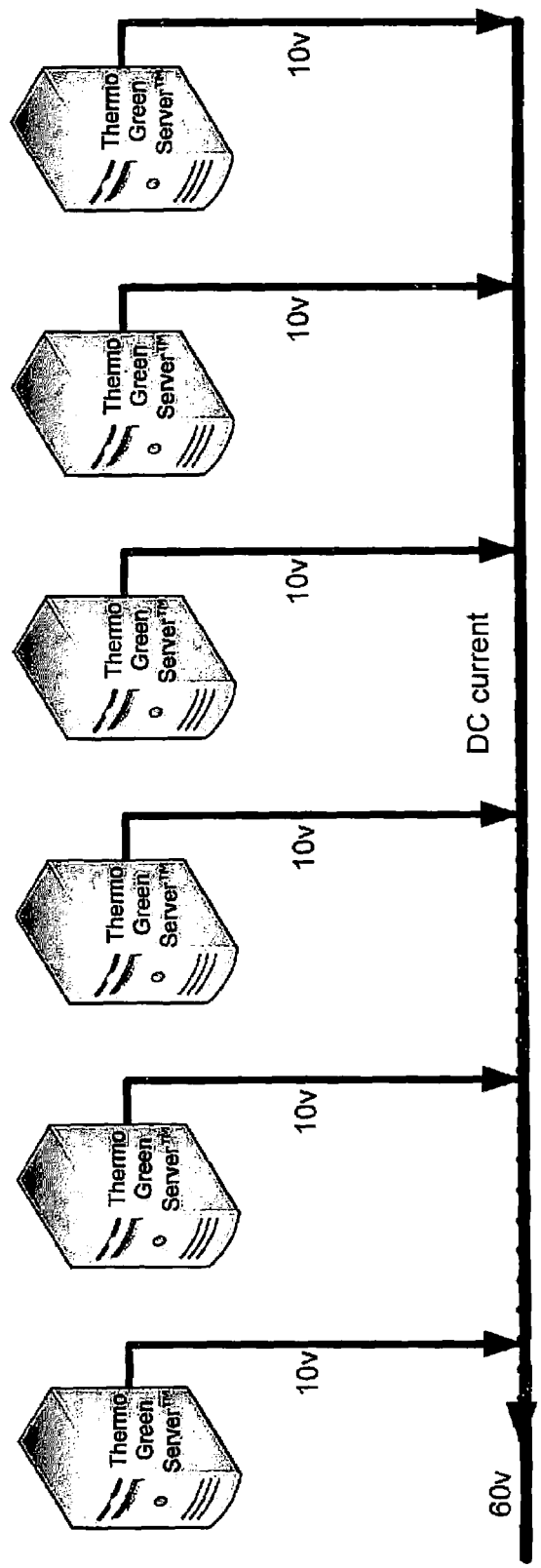
FIG. 11 is a diagram illustrating the concept of the TEG server farm.

FIG. 11 illustrates the concept of the TEG server farm. As shown in FIG. 11, several TEG servers are combined to create a TEG server farm to produce larger scale reusable energy. The DC voltage produced by the TEG server farm can be supplied to, for example, charge uninterruptable power supply systems, power one or more other data center devices, or be rectified back to AC.

Figure 12:
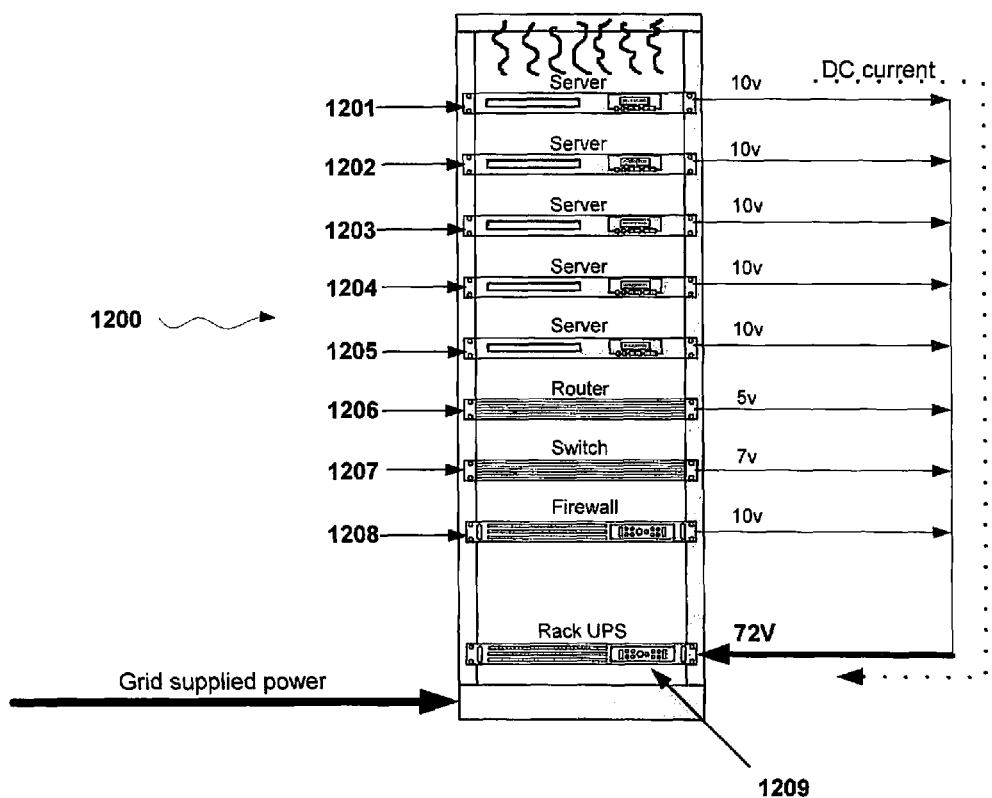
FIG. 12 is a diagram illustrating TEG devices inside a typical data center rack supplying power to an Uninterruptable Power Supply (UPS) system.

FIG. 12 illustrates TEG servers inside a typical data center rack supplying power to a UPS system. Shown in FIG. 12 is rack data center 1200. Included in the rack data center are servers 1201-1205, router 1206, switch 1207, and firewall 1208, each of which includes multiple TEGs integrated therein. The servers 1201-1205 are illustrated as each outputting 10 v DC, the router 1206 5 v DC, the switch 1207 7 v DC, and firewall 1208 10 v DC. This TEG server farm is shown producing 72 v of DC power. The 72 v is shown being supplied to the rack's UPS 1209, and is used, for example, to charge the rack's UPS system. Scaling this solution can result in a significant amount of free energy for many uses, thus basically turning an existing server farm into a small power generating utility right in the data center.

In other embodiments of the invention the power distribution network is integrated into an existing data center's DC based network. By outfitting a server, router or switch with TEG servers the radiated heat generated by the components inside of a server, router or switch can be converted to useful electrical energy to either be used in a recursive manner to reduce the consumption of power from utility grid AC feed to the system to thus bring down the annual cost to power the server, router or switch or to distribute the energy to an external power distribution system to store the energy and/or power another device or devices. The use of multiple TEG servers within a system is employed to scale the amount of useful energy generated and maximize the amount of waste heat generated. The use of TEG servers is appealing for they will generate energy as long as the server is running.

Heat radiating sources in a system as defined above, exhibit that additional waste heat flows in the opposite direction as that of the heat radiating source with a cooling component pumping the heat away from the top of the source. This additional waste heat escapes below the source from its mounting point below the printed circuit board (PCB).

Figure 13:
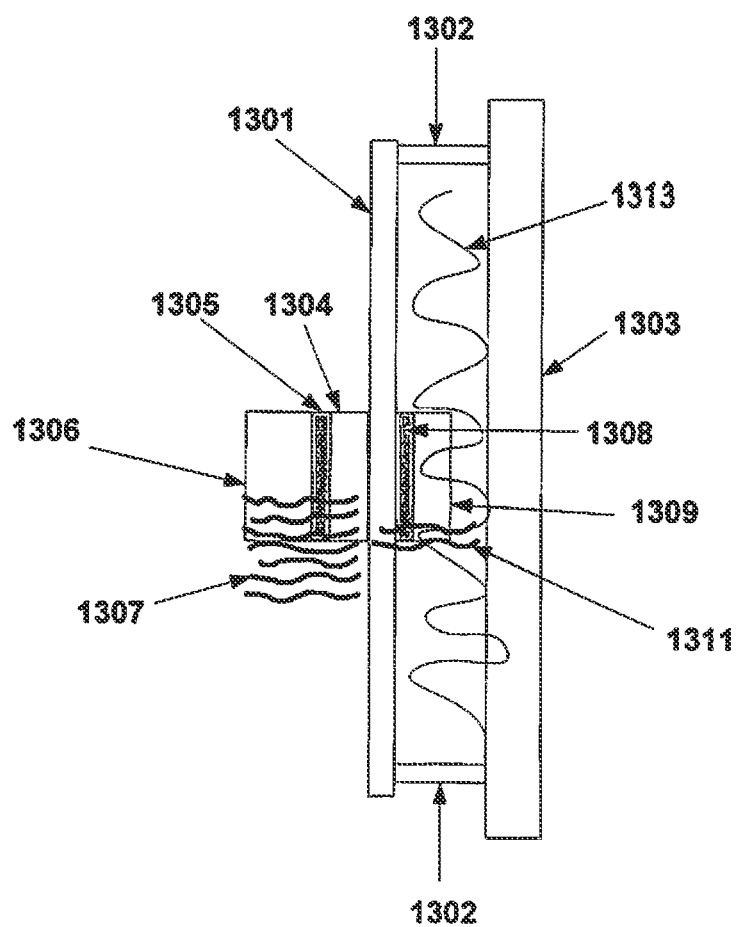
FIG. 13 illustrates an additional embodiment of a method of integrating TEGs within devices that have heat radiating components by applying the TEGs below the heat radiating source.

FIG. 13 illustrates an additional embodiment of a method of integrating TEGs within any type of device that has heat radiating components by applying the TEGs below the heat radiating source in the same manner as in previous embodiments but on the other side of the heat radiating source's printed circuit board (PCB) mounting location. Shown in FIG. 13 are PCB 1301, supports 1302, and system case 1303. The system case 1303 can be a wall or a base of the case. The heat radiating source 1304 is shown with a TEG 1305 and cooling component 1306 as described above, generating electric energy from the radiated heat 1307. Systems with cool air 1313 circulated beneath the system's PCB 1301 will provide a temperature gradient Dt for those TEGs 1308 mounted below the heat radiating source 1304 to convert the heat energy 1311. Compression loading can also be used to apply TEGs 1308 to the PCB 1301. The addition of a heat sink 1309 is optional. The TEGs in this illustration can be wired electrically as outlined above. The additional TEGs applied to the same heat source but one either side will assist in further scaling the energy generated from a heat radiating source(s).

Figure 14:
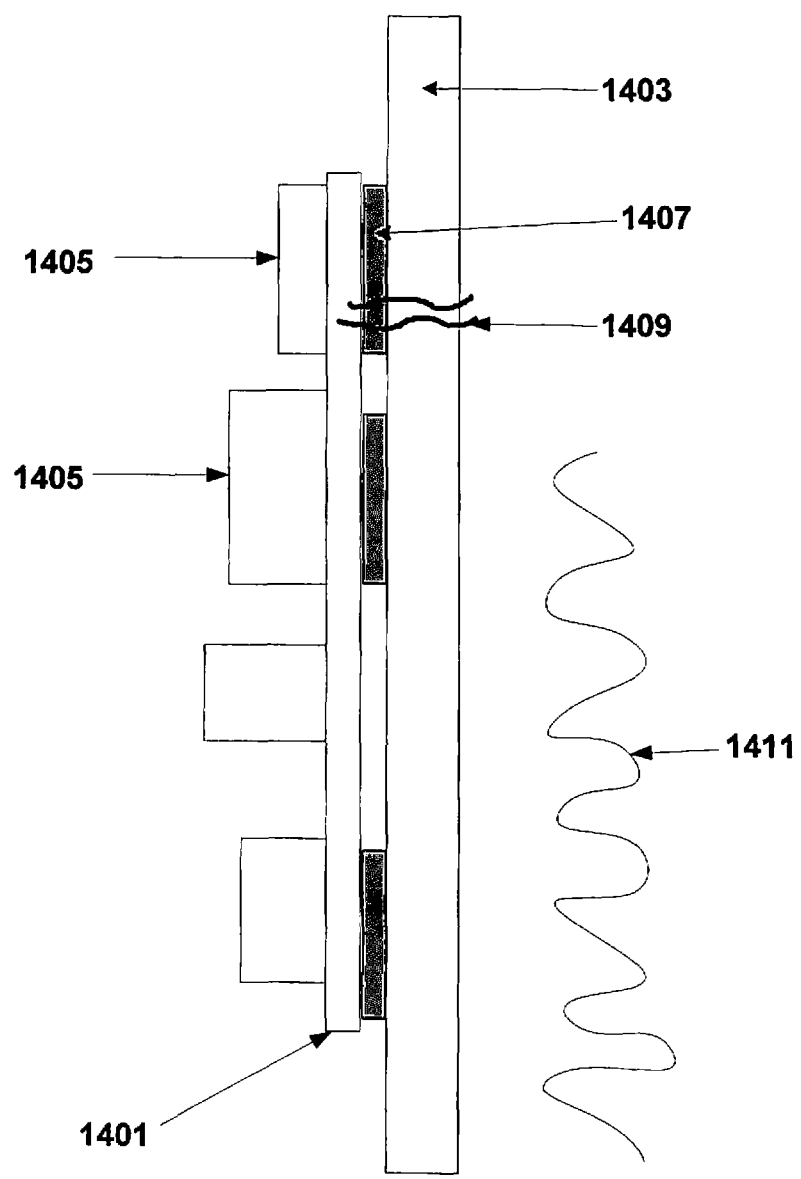
FIG. 14 is another embodiment of the invention where TEGs can be applied to heat sources below the heat source on the heat source's mounting location.

FIG. 14 is another embodiment of the invention where TEGs can be applied to heat sources 1405 below the heat source on the heat source's mounting location on the PCB 1401 but the cold side of the TEG 1407 is in direct contact with the systems metal case 1403. The case 1403 acts as a heat sink to conduct the heat 1409 through the case and out into the cool aisle side 1411 of the system. The TEGs applied in this manner may optionally utilize cooling system or other components used in other embodiments of this invention. The TEGs in this illustration can be wired electrically as outlined in the claims and other embodiments. Any degree of vertical or horizontal orientation of the case can be used.

Figure 15:
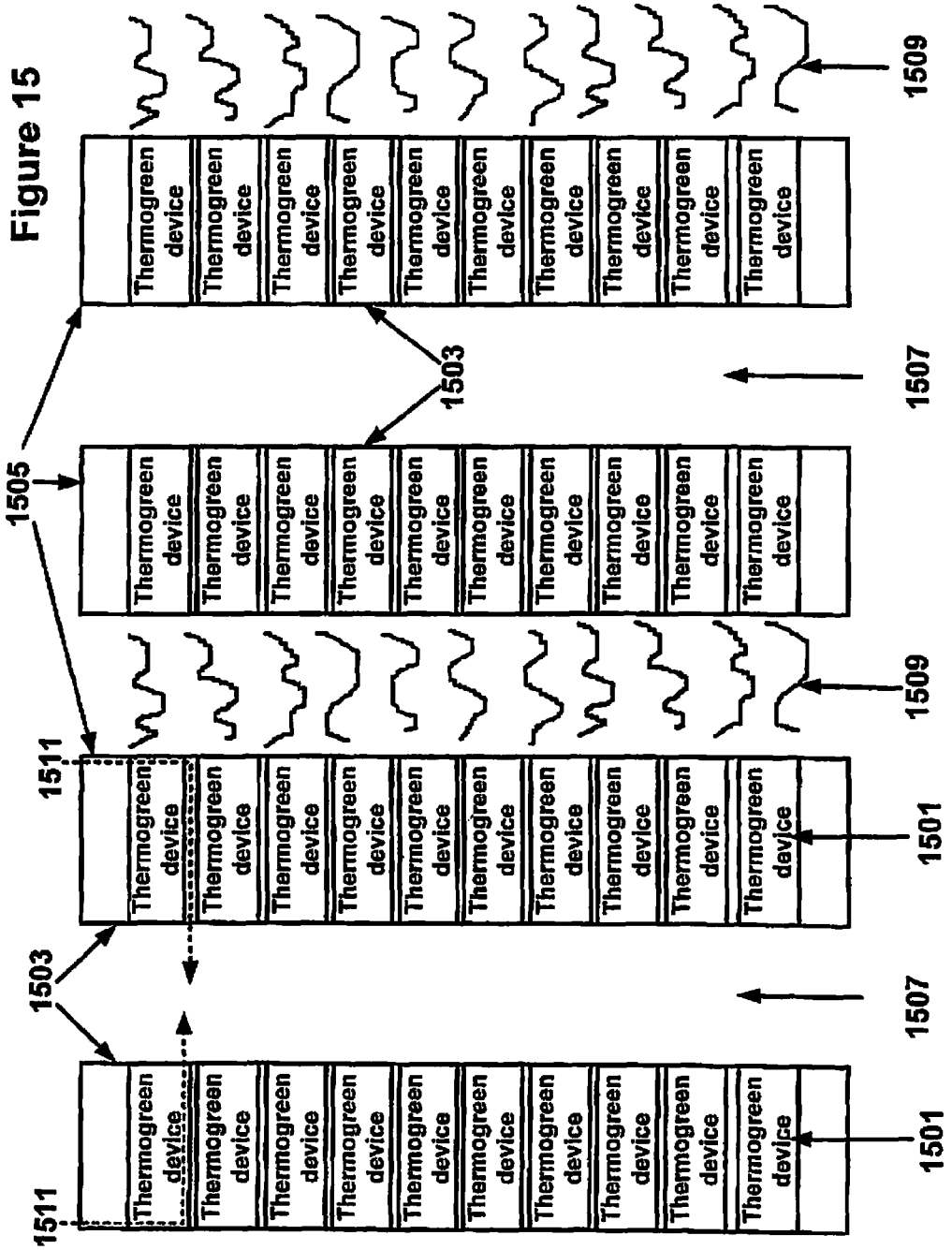
FIG. 15 is an example of a system utilizing TEG integration and arranged in data center racks to utilize the industry standard of cold aisle and hot aisle rack arrangement to cool systems.

FIG. 15 is an example of a system utilizing TEG integration and arranged in data center racks to utilize the industry standard of cold aisle 1507 and hot aisle 1509 rack arrangement to cool systems 1505. The TEG based systems 1501 may be installed in racks 1503 with the TEGs applied below the PCB and or onto the case facing the cold side. As each system uses the case as the heat sink the cold side aisle 1507 will help provide the Dt necessary for the TEGs inside the system to generate a potential difference, as shown at 1511. The TEGs in this illustration can be wired electrically as outlined in the claims and other embodiments.

Figure 16:
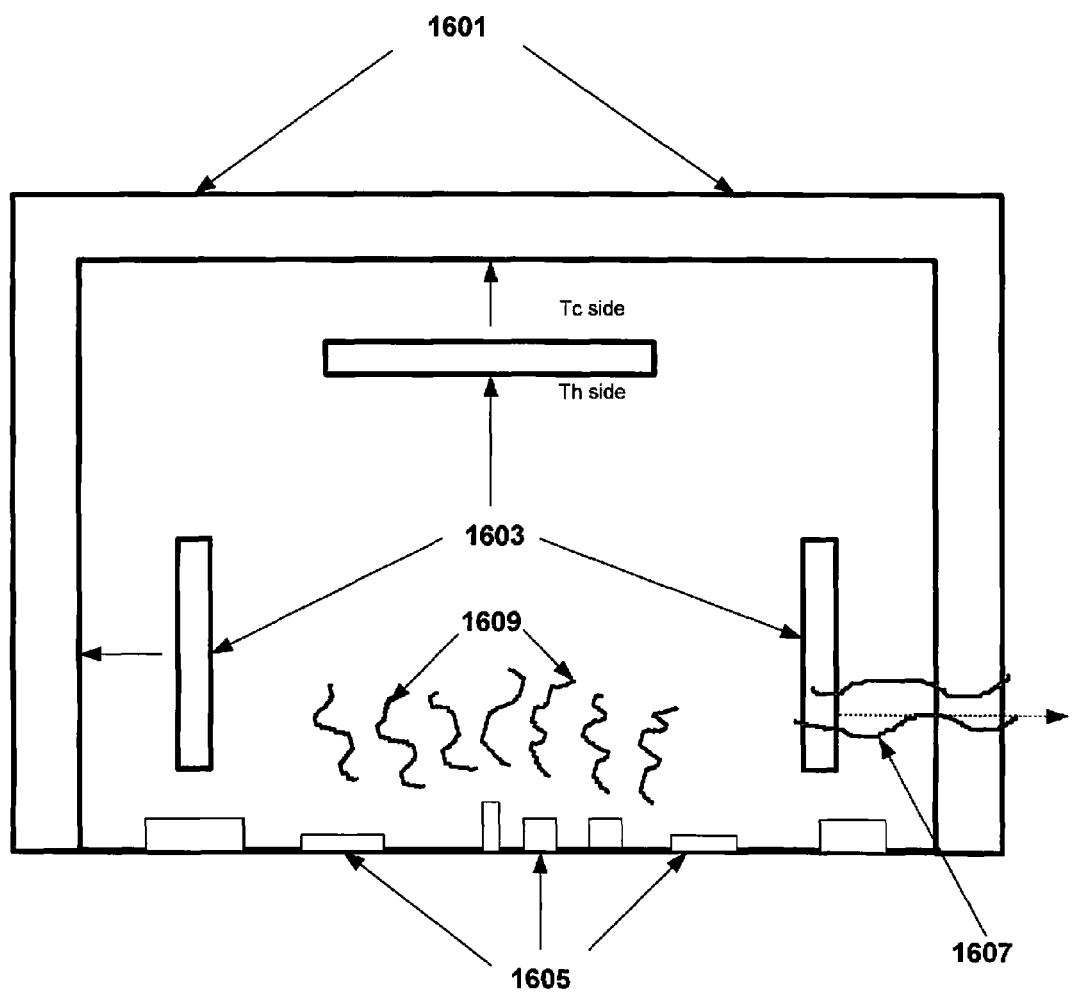
FIG. 16 is an example of an additional method of integrating TEGs onto a system's case walls to convert any ambient radiant heat from components inside the system into electricity.

FIG. 16 is an example of an additional method of integrating TEGs 1603 onto any system's case walls 1601 to convert any ambient radiant heat 1609 from components 1605 inside the system into electricity. The TEGs 1603 operate in the same manner as in previous embodiments. The case 1601 will act as a conductor of the heat energy 1607 passing through the hot Th side of the TEG 1603. The case walls 1601 will be used as the heat sink for the TEGs 1603 attached on the inside wall(s) 1601 and the cool air on the outside of the case 1601 will provide the necessary temperature gradient on the cold Tc side of the TEGs 1603 for the TEGs to generate electricity. The TEGs 1603 can be clamped or mounted into the case wall in any way during manufacturing of the case or as per previous embodiments. The TEGs 1603 in this illustration can be wired electrically as outlined in the claims and other embodiments. In another embodiment, entire arrays of TEGs can be affixed to the case walls to provide maximum heat capture and energy transfer. The cases can be those of any devices, for example, blade servers, routers, firewalls, switches, personal computers, etc. TEGs can be integrated onto any and all heat radiating sources in a blade server to scale the energy generating capabilities. Individual server blades can have TEGs integrated onto them as per previous embodiments as well other components in the blade server chassis such as storage devices and including the chassis walls. The blade server concentrates many heat radiating processors into one chasses to scale computational capabilities in a smaller form factor and is an ideal candidate for TEG integration. Blade servers can be manufacture from OEMs with TEG integrated into them.

FIG. 17A is an example of a self mounting TEG unit. In this embodiment of the invention the TEG 1701 with an integrated cooling component can be mounted to any pre-defined heat radiating source 1702, shown attached to a PCB 1703, in any system according to the type of the self installing unit 1710. This unit 1710 can be clamped or snapped onto the heat radiating source 1702 and mounted as per previous embodiments. The entire unit which is made up of a TEG 1701, cooling component 1704 and clamping device 1705 will comprise one device which can be purchased separately. The adjustable clamps 1705 lock the unit to the heat radiating source 1702 to provide the needed compression loading to improve thermal conductance and create the temperature gradient to generate energy. Other methods for attaching the TEG to a heat radiating source are contemplated, which include, but are not limited to, spring clamps, other mechanical attaching devices, adhesives, etc. The polarity leads 1707 can be connected to the same system or an external power distribution system as per previous embodiments. FIG. 17B depicts the self mounting TEG unit 1710 mounted to a heat radiating source 1702.

Further embodiments of a typical network switch integrated with TEGs include the network switch being a self contained fixed port model or a chassis based model; any type of networking switch or router can be used or built with TEGs integrated.

A data center having hundreds of systems as defined earlier and in operation 24/7/365, once converted to a TEG server, can each generate voltage and produce usable levels of DC. Enough energy can be generated to power other data center devices, used for backup purposes and other uses without the need to draw energy from the local utility feed. Thus, by connecting all of the TEG outfitted data center devices a data center can become a small power generating utility. The scaling of thermoelectric generating devices can assist in reducing power consumption from a typical data center.

By outfitting a server, router, switch or other device in the data center with TEG(s), the radiated heat generated by the components inside of a server, router or switch can be converted to useful electrical energy to either be used in a recursive manner to reduce the consumption of power from utility grid AC feed to the system to thus bring down the annual cost to power the server, router or switch or to distribute the energy to an external power distribution system to store the energy and/or power another device. The use of multiple TEGs within a system is employed to scale the amount of useful energy generated and maximize the amount of waste heat generated. The use of TEGs is appealing for they will generate energy as long as the server is running.

The energy generated from the sum of all TEG servers and systems on the power distribution network can be used to power or assist in powering other data center devices such as other servers, routers, switches, cooling systems, UPS charging. The energy generated from the sum of all the servers generating can offset the cost of the data center's utility bill and reduce the draw from the national grid.

A failure of individual TEGs or the sum of TEGs in an individual server or system will not affect the individual server or system's operation or the power distribution network or other systems connected off the power distribution network. The power distribution network's power management subsystem will manage the drop in energy generated from the missing TEGs.

While the invention has been shown and described with reference to certain preferred embodiments thereof, it will be understood by those skilled in the art that various changes in form and details may be made therein without departing from the spirit and scope of the invention. Consequently, the scope of the invention should not be limited to the embodiments, but should be defined by the appended claims and equivalents thereof.

What is claimed is:

1. A system for generating electrical energy, the system comprising:
a plurality of devices, each of the plurality of devices comprising a converter system, each converter system comprising:
a heat radiating component;
a cooling component; and
a thermal electric generator disposed between the heat radiating component and the cooling component, the thermal electric generator comprising a pair of terminals for connecting to another thermal electric generator;
a case that houses the plurality of devices and comprises one or more thermal electric generators integrated onto walls of the case to convert ambient radiant heat from the plurality of devices into electricity, wherein the one or more thermal electric generators are electrically interconnected to at least one converter system of the plurality of devices,
wherein the plurality of converter systems are electrically interconnected allowing power generated by the plurality of thermal electric generators to power at least one of the plurality of devices or an external device,
wherein the plurality of devices comprise at least one of a server, a router, a switch, and a personal computer, and
wherein the heat radiating component comprises at least one of an Integrated Circuit (IC), a Central Processing Unit (CPU), a network controller, a video controller, a hard disk, a storage controller, and a hot power supply circuitry component.

2. The system of claim 1, wherein the cooling component is one or more of an active cooling device and a passive cooling device.

3. The system of claim 1, wherein a thermally conductive material is integrated between the thermal electric generator and the heat radiating component.

4. The system of claim 1, wherein the converter systems from the plurality of devices are electrically interconnected based on an amount of power required by the at least one of the plurality of devices or an external device.

5. The system of claim 1, wherein compression loading is used to secure the thermal electric generator to the heat radiating component to achieve maximum thermal conductance and generation efficiency of the thermal electric generator.

6. The system of claim 1, wherein compression loading is used to secure the thermal electric generator to the cooling component to achieve maximum thermal conductance and generation efficiency of the thermal electric generators.

7. The system of claim 1, wherein a heat spreader is integrated between the thermal electric generator and the heat radiating component to reduce thermal resistance between the heat radiating component and the thermal electric generator.

8. The system of claim 1, wherein operation of the thermal electric generators is independent from operation of the plurality of devices.

9. The system of claim 1, wherein the thermal electric generator is integrated with the cooling component and attachable to the heat radiating component.

10. The system of claim 1, further comprising a connector system that combines power received from the converter systems and supplies the combined power to offset input power requirements of the at least one of the plurality of devices or the external device.

11. The system of claim 10, wherein the connector system combines the received power according to power requirements of the at least one of the plurality of devices or the external device.

* * * * *